United States Patent
Yagi et al.

(10) Patent No.: US 7,173,232 B2
(45) Date of Patent: *Feb. 6, 2007

(54) LIGHT DETECTION DEVICE AND MOUNTING METHOD THEREOF

(75) Inventors: Shigeru Yagi, Minamiashigara (JP); Seiji Suzuki, Minamiashigara (JP); Takashi Kurita, Yokohama (JP); Shizuo Yamamoto, Kamiii-gun (JP)

(73) Assignees: Fuji Xerox Co., Ltd., Tokyo (JP); Macnica, Inc., Yokohama (JP); K-Tech Devices Corporation, Nagano (JP)

( * ) Notice: Subject to any disclaimer, the term of this patent is extended or adjusted under 35 U.S.C. 154(b) by 18 days.

This patent is subject to a terminal disclaimer.

(21) Appl. No.: 10/816,853

(22) Filed: Apr. 5, 2004

(65) Prior Publication Data
US 2004/0200951 A1 Oct. 14, 2004

(30) Foreign Application Priority Data
Apr. 8, 2003 (JP) .............................. 2003-104477

(51) Int. Cl.
*H01L 31/00* (2006.01)
*H01L 27/14* (2006.01)

(52) U.S. Cl. .............................. 250/214.1; 250/214 R; 250/239; 257/431; 257/459; 257/690; 257/698; 438/57; 438/98

(58) Field of Classification Search ............ 250/214 R, 250/214.1, 239; 257/431, 433, 434, 436, 257/459, 690, 698; 438/57, 64, 98
See application file for complete search history.

(56) References Cited

U.S. PATENT DOCUMENTS

| | | | | |
|---|---|---|---|---|
| 4,811,069 A | * | 3/1989 | Kakinuma et al. | ............ 257/54 |
| 5,155,612 A | | 10/1992 | Adachi et al. | |
| 5,243,260 A | * | 9/1993 | Vinouze et al. | .......... 315/169.1 |
| 5,473,512 A | * | 12/1995 | Degani et al. | .............. 361/760 |
| 5,729,437 A | * | 3/1998 | Hashimoto | ................... 361/760 |
| 5,821,532 A | * | 10/1998 | Beaman et al. | ............. 250/239 |
| 6,300,159 B1 | * | 10/2001 | Mochizuki | ................... 438/67 |

(Continued)

FOREIGN PATENT DOCUMENTS

JP 07038138 A * 2/1995

(Continued)

*Primary Examiner*—Stephone B. Allen
*Assistant Examiner*—Davienne Monbleau
(74) *Attorney, Agent, or Firm*—Oliff & Berridge, PLC (57) ABSTRACT

A light detection device which can be stably surface-mounted on, for example, a circuit board or the like, and a mounting method thereof are provided. A light-receiving element includes, a transparent conductive electrode (first electrode), a semiconductor layer, and an electrode (first electrode), which are sequentially laminated on a transparent substrate. An insulative substrate includes a terminal electrode (second electrode) which is provided to be exposed at first and second faces of the insulative substrate. The light-receiving element is disposed at the first face of the insulative substrate, and the transparent conductive electrode and the electrode are electrically connected with the terminal electrode exposed at the first face of the insulative substrate. Hence, the light detection device with this structure is surface-mounted on the circuit board such that the terminal electrode exposed at the second face of the insulative substrate connects with an external terminal of the circuit board.

23 Claims, 4 Drawing Sheets

U.S. PATENT DOCUMENTS

| | | | | |
|---|---|---|---|---|
| 6,340,606 | B1* | 1/2002 | Hashimoto | 438/106 |
| 6,365,963 | B1* | 4/2002 | Shimada | 257/686 |
| 6,455,774 | B1* | 9/2002 | Webster | 174/52.4 |
| 6,611,064 | B1* | 8/2003 | Kousaka et al. | 257/787 |
| 6,639,705 | B2 | 10/2003 | Hira | |
| 6,649,834 | B1* | 11/2003 | Hsieh et al. | 174/52.4 |
| 6,680,525 | B1* | 1/2004 | Hsieh et al. | 257/680 |
| 6,706,967 | B2* | 3/2004 | Hayasi | 174/52.2 |
| 6,737,677 | B2 | 5/2004 | Shimoida et al. | |
| 6,806,560 | B2* | 10/2004 | Kobayashi | 257/676 |
| 6,891,273 | B2* | 5/2005 | Pu et al. | 257/780 |
| 6,992,395 | B2* | 1/2006 | Fukasawa | 257/777 |
| 7,015,579 | B2* | 3/2006 | Okada et al. | 257/738 |
| 2002/0030266 | A1* | 3/2002 | Murata | 257/698 |
| 2002/0043613 | A1* | 4/2002 | Suzuki et al. | 250/214.1 |
| 2002/0056924 | A1* | 5/2002 | Chung et al. | 257/784 |
| 2005/0051859 | A1* | 3/2005 | Hoffman | 257/434 |
| 2005/0121767 | A1* | 6/2005 | Celaya et al. | 257/692 |

FOREIGN PATENT DOCUMENTS

JP    A 2001-210856    8/2001

* cited by examiner

LIGHT DETECTION DEVICE AND MOUNTING METHOD THEREOF

CROSS-REFERENCE TO RELATED APPLICATION

This application claims priority under 35 USC 119 from Japanese Patent Application No. 2003-104477, the disclosure of which is incorporated by reference herein.

BACKGROUND OF THE INVENTION

1. Field of the Invention

The present invention relates to a light detection device such as an ultraviolet light detection device or the like, and to a method for mounting the light detection device.

2. Description of the Related Art

In recent years, industrial devices in which ultraviolet light is applied have included color image-outputting devices, ozone generating devices, semiconductor fabrication devices and the like, and have been applied to many fields, such as printing, coating, photofabrication and the like. Semiconductor light-receiving elements have been employed for measuring ultraviolet light.

As semiconductor light-receiving elements, the use of gallium nitride-based semiconductors, oxide semiconductors and the like, which do not absorb visible light, has been proposed. With nitride semiconductors, ultraviolet light-receiving elements of polycrystalline gallium nitride formed on transparent conductive glass substrates have been realized. Ordinarily, in a case in which a semiconductor light-receiving element is to be used as a light-receiving element in the form of a chip, the light-receiving element is installed in a metal, plastic or ceramic casing, and a protective layer is formed thereon before use.

These light-receiving elements are mounted in circuits, amplifiers and the like, using metallic wiring pins, plate-form terminal electrodes and the like as output terminals from the light-receiving elements. Therefore, in the current circumstances, the light-receiving elements are not suitable for surface-mounting.

A thin-shaped ultraviolet light detection device in which a light-receiving element is fixed to a protective member by an epoxy adhesive has been proposed in, for example, Japanese Patent Application Laid-Open (JP-A) No. 2001-210856. However, line-shaped or rod-shaped electrodes are provided thereto as output electrodes, and this is not suitable for surface-mounting.

Therefore, in order that these light-receiving elements may be employed in large quantities by automatic devices and in accordance with the miniaturization of electronic devices in recent years, forms of these elements which are suitable for surface-mounting techniques are desirable, and improvements have been hoped for.

SUMMARY OF THE INVENTION

The present invention has been devised in consideration of various problems described above. The present invention provides a light detection device capable of stable surface-mounting on, for example, a circuit board or the like, and a mounting method of the light detection device.

A light detection device of a first aspect of the present invention includes: a light-receiving element including a semiconductor layer for detecting light and a first electrode which is electrically connected with the semiconductor layer; an insulative substrate for supporting the light-receiving element; and a second electrode which is provided so as to be exposed at a first face and a second face of the insulative substrate. Moreover, the light-receiving element is disposed on the first face of the insulative substrate, and the first electrode is electrically connected with the second electrode that is exposed at the first face of the insulative substrate.

In the light detection device of the present aspect, the light-receiving element is disposed on the first face of the insulative substrate, and the second electrode, which is exposed at the first face (for example, a front face) of the insulative substrate is electrically connected with the semiconductor layer of the light-receiving element by the first electrode. Thus, when the light detection device is to be mounted at, for example, a circuit board or the like, the second electrode, which is exposed at the second face (for example, an end face (side face) or a rear face) of the insulative substrate, is electrically connected with an external terminal of the circuit board. Thus, stable surface-mounting on, for example, a circuit board or the like is enabled with a simple structure and without greatly altering structure of the light-receiving element.

In a light detection device mounting method of a second aspect of the present invention, the semiconductor device of the present invention described above is surface-mounted on the circuit board such that the second electrode, which is exposed at the second face of the insulative substrate, is connected with the external terminal of the circuit board. Thus, as described above, stable surface-mounting is enabled.

That is, the light detection device mounting method of the present aspect includes: preparing a light-receiving element which includes a semiconductor layer for detecting light and a first electrode which is electrically connected with the semiconductor layer; providing a second electrode so as to be exposed at a first face and a second face of an insulative substrate; preparing the light detection device by disposing the light-receiving element on the first face of the insulative substrate such that the first electrode is electrically connected with the second electrode that is exposed at the first face of the insulative substrate; and surface-mounting the light detection device on a circuit board such that the second electrode that is exposed at the second face of the insulative substrate is connected with an external terminal of the circuit board.

BRIEF DESCRIPTION OF THE DRAWINGS

An embodiment of the present invention will be described in detail based on the following figures, wherein.

DETAILED DESCRIPTION OF THE INVENTION

Herebelow, an example of an embodiment of the present invention will be described with reference to the drawings. Note that descriptions are given with items that have substantially the same functions being given the same reference numerals in all the drawings, and descriptions thereof may be omitted in some cases.

Figure 1:
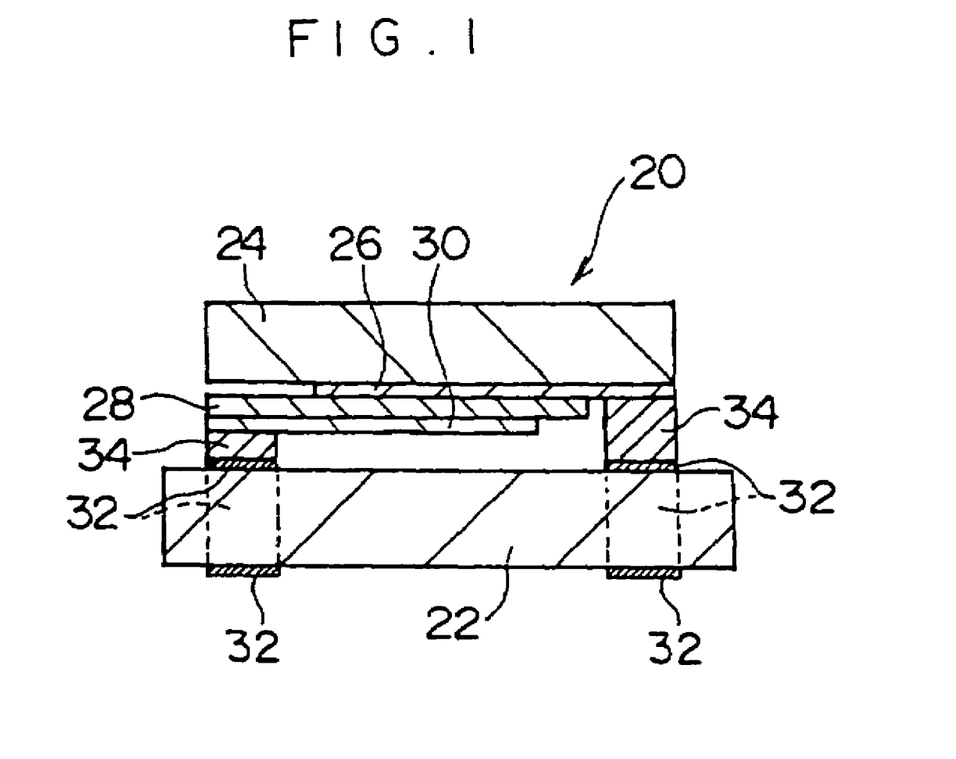
FIG. 1 is a schematic structural view showing a light detection device relating to an embodiment of the present invention.

FIG. 1 is a schematic structural view showing a light detection device relating to the embodiment of the present invention.

The light detection device of the present embodiment is structured by a light-receiving element 20 which is disposed on an insulative substrate 22. The present embodiment has a structure in which one of the light-receiving elements 20 is disposed on one insulative substrate 22. However, a structure in which plural light-receiving elements 20 are disposed on one insulative substrate in an array form or in a stacked form is also possible.

The light-receiving element 20 is structured by laminating a transparent conductive electrode 26 (a first electrode), a semiconductor layer 28 and an electrode 30 (the first electrode) in this order on a transparent substrate 24.

At the insulative substrate 22, terminal electrodes 32 (a second electrode) are provided so as to extend from a front face (first face) to an end face or rear face (second face). These terminal electrodes 32 may have any structures as long as those structures enable the terminal electrodes 32 to connect with electrodes of the light-receiving element (the first electrode) and, at a time of mounting on, for example a circuit board or the like, enable the terminal electrodes 32 to connect with external electrodes of the circuit board or the like. The terminal electrodes 32 should be provided so as to be exposed at the first face, at which the light-receiving element is disposed, and at the second face, which is different from the first face. For example, the terminal electrodes 32 may be provided so as to extend from a front face of the insulative substrate 22 to an end face of the same (in this mode, the second face corresponds to the end face). Alternatively, a through-hole may be formed in the insulative substrate 22 and a conductive material is embedded in this through-hole, so that the terminal electrodes 32 are provided so as to be exposed at front and rear faces of the insulative substrate. The terminal electrodes 32 that are exposed at the second face, which is different from the first face of the insulative substrate 22, are output terminals of the light detection device.

Thus, the light-receiving element 20 is disposed at the front face of the insulative substrate 22. Further, the transparent conductive electrode 26 and the electrode 30 of the light-receiving element 20 are conductively connected, via conductive members 34, to the terminal electrodes that are exposed at the front face (first face) of the insulative substrate.

Figure 2:
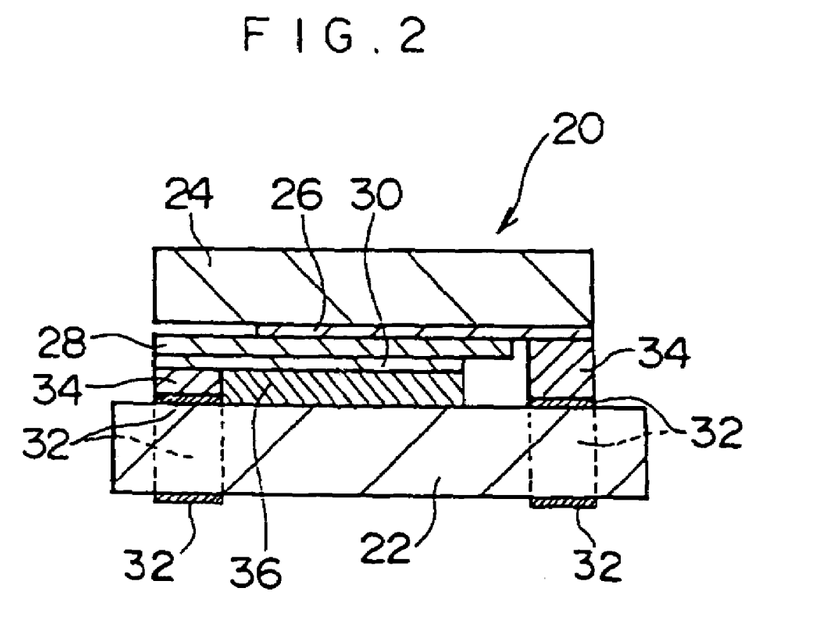
FIG. 2 is a schematic structural view showing another example of the light detection device relating to the embodiment of the present invention.

Here, as shown in FIG. 1, the light-receiving element 20 may have conductive paths formed via the conductive members 34, and the light-receiving element 20 may be fixed to the insulative substrate 22 by being adhered to the conductive members 34. Alternatively, as shown in FIG. 2, the whole of the light-receiving element 20 (except for connection portions corresponding to the conductive members 34) may be fixed to the insulative substrate 22 by an adhesive layer 36. Moreover, a portion of the light-receiving element 20 (excluding the connection portions corresponding to the conductive members 34) may be fixed to the insulative substrate via the adhesive layer 36.

Further, a mode in which a recess portion is formed in the insulative substrate 22 beforehand, and the light-receiving element 20 is embeddedly provided in this recess portion is also possible. Hence, it is possible to avoid light entering through end faces of the light-receiving element 20, and favorable operation is possible.

Figure 3:
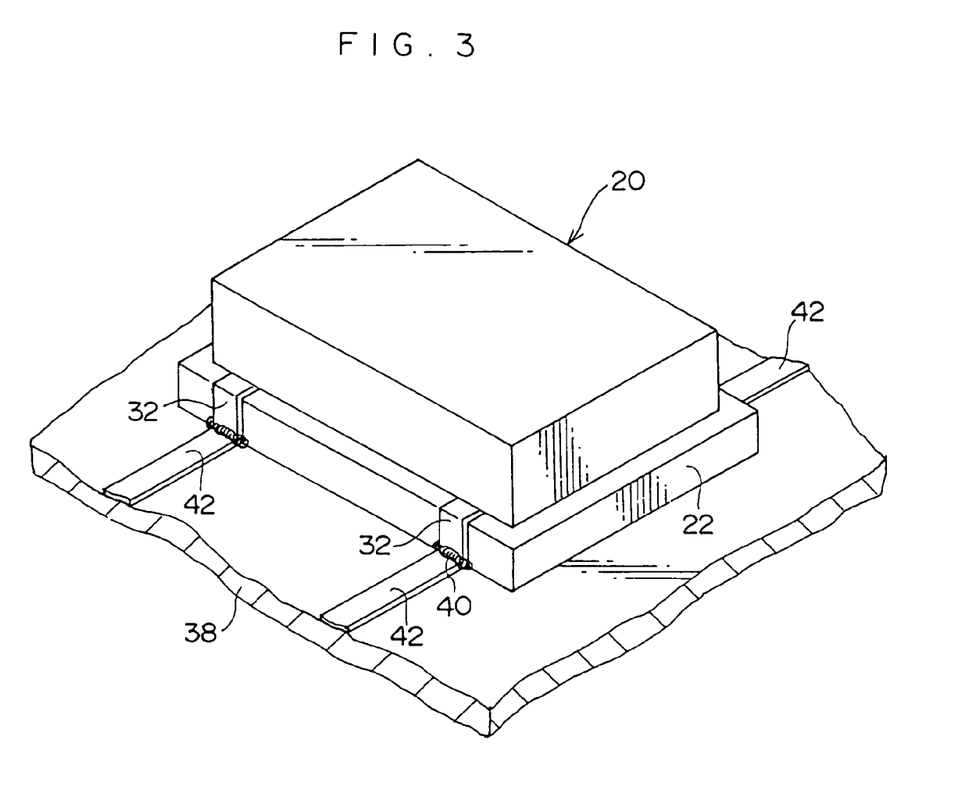
FIG. 3 is a schematic view for explaining a mounting method of the light detection devices relating to the embodiment of the present invention.

A light detection device with the structure described above is surface-mounted on a circuit board. As shown in FIG. 3, positioning is performed such that, for example, external terminals 42 on a circuit board 38, on which cream solders 40 have been printed, electrically connect with the terminal electrodes 32 that are exposed at the rear face (second face) of the insulative substrate 22. Hence, for example, reflow processing is implemented, and surface-mounting on the circuit board is completed.

Here, solder is preferable for achieving electrical contact between the circuit board 38 and the light detection device. However, curable conductive resins are also preferable in view of adhesive strength, heat resistance and environmental stability. A filler such as a metal, carbon or the like may be utilized as a conduction agent of a curable conductive resin. A resin that is commonly employed as an adhesive may be utilized as a curable conductive resin. An ordinary silver epoxy-type conductive resin in which silver particles are dispersed may be utilized as a curable conductive resin. Anisotropic conductive materials may also be utilized as a curable conductive resin.

With the present embodiment as described above, stable surface-mounting on a circuit board or the like is enabled with a simple structure and without greatly altering a structure of the light-receiving element. Further, the light detection device of the present embodiment employs a particular nitride semiconductor as the semiconductor layer 28. As a result, a heat-resistant light-receiving element is realized with a thin and compact form. Consequently, a solder reflow process can be applied to the electronic circuit board and, in particular, a light detection device which is excellent for mass production is possible.

Below, each member of the present embodiment will be described in further detail.

The insulative substrate 22 is required to have a heat resistance of at least 100° C., and a material may be employed that is electrically insulative. The insulative substrate 22 may be transparent, may be opaque, and may be colored. Specifically, the insulative substrate 22 is preferably structured by, for example, ceramics such as glasses, oxides and nitrides; materials formed of crystals such as sapphire, quartz and the like; plastics which are mixtures of organic polymer resins and inorganic materials; and the like. Among them, ceramics and plastics are preferable in view of processability and availability.

As structural materials of the terminal electrodes 32, metals may be used and oxide conductors may be used. The terminal electrodes 32 that are exposed at the end face (second face) of the insulative substrate are electrically connected with external terminals of a circuit board in a procedure for surface-mounting of the light detection device. Accordingly, the terminal electrodes 32 is preferably structured by conductive materials which are solder compatible, and which are ordinarily used as connection members, and it is preferable if the terminal electrodes 32 are metal electrodes. However, in a surface-mounting procedure in which a conductive resin is employed as a connection member, the terminal electrodes 32 may be conductive materials to which soldering is not applicable, such as an oxide conductor or the like.

The terminal electrodes 32 may be formed at the insulative substrate 22 by plating, vapor-depositing or sputtering, for example, Au, Ag, Ni, Pd, Pt, Al, Cu, an alloy or the like, or by heat-sintering a paste formed of an organic polymer compound and a metal. Further, the terminal electrodes 32 may be formed by adhering, for example, thin plates of metal to surfaces of the insulative substrate 22.

The semiconductor layer 28 of the light-receiving element may be structured by a nitride including at least one of Al, Ga and In with nitrogen. A light-receiving element which utilizes such a nitride semiconductor can be structured as an ultraviolet light-receiving element with a compact, thin form. Such a nitride semiconductor is preferable, because wavelengths of light that are received can be freely changed by changing the composition of the semiconductor.

Crystalline characteristics of the nitride semiconductor are not particularly limited: the nitride semiconductor may be non-crystalline, may be formed with microcrystalline phases, may have a state in which microcrystalline and non-crystalline phases are mixed, may be polycrystalline, and may be a single crystal. A crystal system may be either of a cubic system and a hexagonal system, and may be in a state in which plural crystal systems are mixed. A size of microcrystals is from 5 nm to 5 μm, and can be measured by X-ray diffraction, electron diffraction, and profile measurements using cross-sectional electron micrographs. Further, a crystal may be grown in a columnar form, may be a film having a form in which crystal surface orientations are aligned to a high degree of alignment, and having a single peak in an X-ray diffraction spectrum, and may be a single crystal.

If the nitride semiconductor is non-crystalline, the semiconductor may include hydrogen with a hydrogen density of not less than 0.5 at % and not more than 50 at %, and may further include a single-bond halogen element.

If the hydrogen included in the nitride semiconductor is less than 0.5 at %, the hydrogen is insufficient for eliminating bonding defects at crystal boundaries, and bonding defects and unmatched bonds within non-crystalline phases, by bonding with hydrogen, and for deactivating defect levels which are formed in band characteristics. Thus, bonding defects and structural defects are more numerous, dark resistance is lower and light sensitivity is lost. As a result, the nitride semiconductor cannot function as a practical photoconductor.

On the other hand, if the hydrogen included in the nitride semiconductor exceeds 50 at %, probabilities of two or more hydrogens bonding with group III elements and group V elements will increase. Consequently, these elements will not hold three-dimensional structures, so as to form two-dimensional and chain-form networks. In particular, voids will occur in large quantities at crystal grain boundaries. Therefore, as a result, new levels will be formed in band characteristics, electrical characteristics will deteriorate, and mechanical characteristics such as hardness and the like may be reduced. Moreover, the layer will oxidize more easily, as a result of which impurity defects will occur in large numbers within the layer, and excellent photoelectrical characteristics may not be obtainable.

Further, if the hydrogen included in the nitride semiconductor exceeds 50 at %, dopants, which are doped in order to control electrical characteristics, will be inactivated by the hydrogen. As a result, a non-single crystalline photosemiconductor formed by an electrically active non-crystalline material or microcrystals may not be obtainable.

Here, absolute values of hydrogen density can be measured by hydrogen forward scattering (HFS). Further, estimations thereof are possible by measuring amounts of hydrogen released by heating, or by measuring IR (infrared) spectra. Further still, hydrogen bonding states thereof can be easily measured by infra-red absorption spectra.

An atomic ratio between group III elements that are included in the nitride semiconductor and the nitrogen atoms is preferably in a range from 0.5:1.0 to 1:0.5. If the atomic ratio is less than 0.5:1.0, or is greater than 1:0.5, there will be fewer portions at which bonds between group III elements and nitrogen atoms adopt tetragonal forms, defects will be more numerous, and favorable functionality as a nitride semiconductor may be lost.

In a case in which there are two or more group III elements included in the nitride semiconductor, a band gap of the nitride semiconductor can be adjusted to a desired value by altering mixture ratios thereof. For example, with a GaN:H base composition having a band gap of 3.2 to 3.5 eV (corresponding to an absorption edge at long wavelengths of approximately 420 nm to 300 nm), it is possible to adjust to a band gap of 3.5 to 6.5 eV (corresponding to an absorption edge at long wavelengths of 300 nm to 180 nm) by adding Al to this composition. The band gap can be further adjusted by addition of Al and In to the base composition.

Each element in a composition included in the nitride semiconductor can be measured by a method such as X-ray photoelectron spectroscopy (XPS), electron microprobing, Rutherford backscattering (RBS), secondary ion mass spectrometry or the like.

Now, beside the nitride semiconductors described above, the semiconductor layer 28 can be structured by a wide-band-gap oxide semiconductor such as titanium oxide, zinc oxide or the like.

Titanium oxide may be crystalline or microcrystalline, may be polycrystalline, and may have rutile or anatase forms. Zinc oxide may be crystalline or microcrystalline, and may be polycrystalline.

These oxide semiconductors have smooth surfaces and are transparent. Titanium oxide and zinc oxide are n-type semiconductors due to oxygen bonding defects caused by variations of oxygen density from chemical stoichiometric ratios, and form Schottky barriers with transparent conductive electrodes. Composition ratios of oxygen to-titanium or zinc from 0.9 to 1.2 can be employed. Electrical characteristics of these oxide semiconductors can be controlled, after production, by carrying out hydrogen plasma processing, thermal annealing processing in a hydrogen atmosphere, or the like.

A size of crystals in an oxide semiconductor may be from 5 nm to 50 μm. Crystal sizes can be measured by X-ray diffraction, electron diffraction and profile measurements using cross-sectional electron micrographs.

An oxide semiconductor can be produced by vapor deposition, reactive vapor deposition, ion plating, sputtering, reactive sputtering, a CVD process of reacting a metal chlorine compound or organic compound with oxygen, or by hydrolysis or thermal decomposition of a metal alkoxide compound or metal chelate compound.

Here, it is possible to employ titanium oxide or zinc oxide as a material for vapor deposition, reactive vapor deposition, ion plating, sputtering or reactive sputtering, and to form a film with the titanium oxide or zinc oxide in an atmosphere including oxygen as a material. Further, a method of directly reacting titanium and oxygen as a material is also possible.

Further, it is also possible to produce an oxide semiconductor using a gas of titanium chloride, titanium alkoxide, zinc chloride or zinc alkoxide, by decomposition-reacting them in a heated state in an oxygen atmosphere or oxygen plasma.

The transparent substrate 24 may be conductive or insulative, and may be crystalline or non-crystalline. For a conductive substrate, semiconductors such as GaN, SiC, ZnO and the like are available.

An insulative substrate to whose surface conductivity processing has been applied may be employed as the transparent substrate 24. For an insulative substrate, a transparent inorganic material such as glass, quartz, sapphire, MgO, LiF, CaF$_2$ or the like, or a transparent polymer film, plate or the like of fluorine resin, polyester, polycarbonate, polyethylene, polyethylene terephthalate, epoxy or the like may be employed. In cases in which ultraviolet light of wavelength 330 nm or less is to be measured, quartz, sapphire, MgO, LiF, CaF$_2$ and the like are preferable.

Note that light is made incident to the light detection device (light-receiving element) from the transparent substrate 24 side thereof, and the transparent substrate 24 may also serve as an optical filter in order to control spectral responsivity.

The transparent conductive electrode 26 may be formed by a process of vapor deposition, ion plating, sputtering or the like using a transparent conductive material such as ITO, zinc oxide, tin oxide, lead oxide, indium oxide, copper iodide or the like. Alternatively, a transparent conductive electrode which is formed to be so thin as to be semitransparent by vapor-depositing or sputtering a metal such as Al, Ni, Au or the like may be used.

The electrode 30 may be formed by a process of vapor deposition, ion plating, sputtering or the like using a transparent conductive material such as ITO, zinc oxide, tin oxide, lead oxide, indium oxide, copper iodide or the like. Alternatively, an electrode which is formed by vapor-depositing or sputtering a metal such as Al, Ni, Au, Ag, Ti, Pt or the like may be used. The electrode 30 need not necessarily transmit light. In cases in which a metal is used for forming the electrode 30, the electrode 30 operates as a mirror which reflects light (for example, ultraviolet light) that has been transmitted through the semiconductor layer 28, and is favorable in that overall sensitivity is improved.

For the adhesive layer 36, acrylic resin, polyesters polyvinyl chloride, polyethylene, polypropylene, polyurethane, epoxy resin or the like may be employed. Among them, silicone resins are favorable in having low UV absorption, processability and heat-resistance. Denatured silicone resins can also be used. For the adhesive layer 36, curable silicone and room temperature curable silicone may be employed. For the adhesive layer 36 using a resin material, various processes are applicable, such as spray coating, printing with a bar coater, screen printing, blade printing, drop processes, etc.

As the conductive members 34, for example, curable conductive resins are preferable in regard to adhesive strength, heat resistance and environmental stability. A filler such as a metal, carbon or the like may be employed as a conduction agent of a curable conductive resin. A resin that is commonly employed as an adhesive may be employed as a resin of the curable conductive resin. A usual silver epoxy-type conductive resin in which silver particles are dispersed may be employed as a curable conductive resin. Further, anisotropic conductive materials may be employed as curable conductive resins. As a specific example of such a conductive resin, for example, a thermosetting silver paste or the like may be utilized.

Note that, in the light detection device of the present invention, the first electrode and the second electrode may each be structured by two or more electrodes. Ordinarily, because two electrical connections are formed from one semiconductor layer, each of the first and second electrodes may be formed as a pair.

In the light detection device of the present invention, the second electrode may be a metal electrode. When the second electrode is made as a metal electrode, at a time of electrical connection to an external terminal of, for example, a circuit board, it is possible to use, for example, solder, and more effective surface-mounting is possible.

In the light detection device of the present invention, the insulative substrate may absorb visible light. When the insulative substrate absorbs visible light, reflection of light that has been transmitted through the semiconductor layer of the light-receiving element at the insulative substrate and re-irradiation of this light to the semiconductor layer is prevented, and accurate light detection is possible.

In the light detection device of the present invention, as a structure of the light-receiving element, a structure in which the semiconductor layer and the first electrode are provided on a transparent substrate is possible.

In the light detection device of the present invention, the semiconductor layer of the light-receiving element may be structured with a nitride including nitrogen and at least one of Al, Ga and In. A light-receiving element utilizing such a nitride semiconductor can be structured as an ultraviolet light-receiving element with a compact and thin shaped.

In the present invention, a structure in which the second electrode is provided so as to be exposed at front and rear of the insulative substrate, the light-receiving element is disposed on the front face of the insulating substrate, and the first electrode is electrically connected with the second electrode that is exposed at the front face of the insulative substrate is a favorable mode.

EXAMPLES

Below, the present invention will be more specifically described by presenting Examples. Note that these Examples do not limit the invention.

Figure 4:
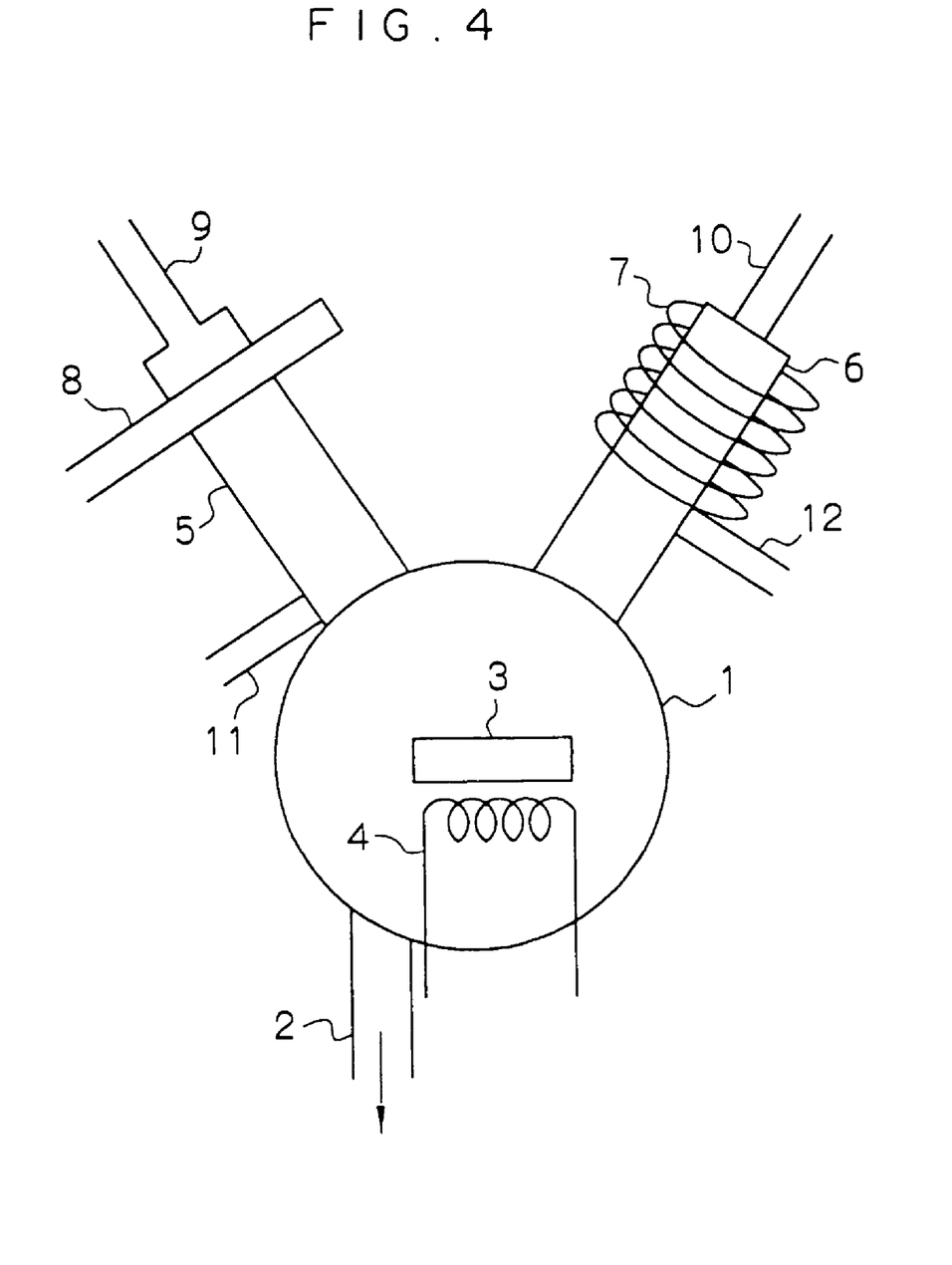
FIG. 4 is a schematic structural view showing a deposition apparatus which is employed in production of nitride semiconductors.

A deposition apparatus shown in FIG. 4 is used for the formation of semiconductor layers of the present Examples. At the deposition apparatus shown in FIG. 4, 1 denotes a vacuum chamber, 2 denotes an evacuation port, 3 denotes a substrate holder, 4 denotes a heater for heating a substrate, 5 and 6 denote quartz pipes which are connected to the vacuum chamber 1, and the quartz pipes 5 and 6 are communicated with gas introduction pipes 9 and 10, respectively. In addition, a gas introduction pipe 11 is connected to the quartz pipe 5, and a gas introduction pipe 12 is connected to the quartz pipe 6. In the deposition apparatus shown in FIG. 4, N$_2$, for example, is used as a source of the element nitrogen, and is introduced through the gas introduction pipe 9 to the quartz pipe 5. Microwaves are fed into a microwave wave-guide 8, which is connected to a microwave oscillator (not shown) which uses a magnetron, and electrical discharges are caused to occur in the quartz pipe 5. H$_2$, for example, is introduced to the quartz pipe 6 through the other gas introduction pipe 10. High frequency waves are supplied to a high frequency coil 7 from a high frequency oscillator (not shown), and electrical discharges are caused to occur in the quartz pipe 6. A nitride semiconductor film can be formed on the substrate by introducing, for example, trimethyl gallium through the gas introduction pipe 12 at a downstream side relative to a discharge space.

Example 1

First, a washed 0.5 mm borosilicate glass substrate (1.2 by 1.8 mm) is sputtered with indium tin oxide (ITO) to 1000 Å using a metal mask. This substrate (the transparent substrate 24 on which the transparent conductive electrode 26 is formed) is then placed on the substrate holder 3, which is disposed in the vacuum chamber. After evacuation of the interior of the vacuum chamber 1 via the evacuation port 2, the substrate is heated to 400° C. by the heater 4. N$_2$ gas is introduced into the quartz pipe 5, which has a diameter of 25 mm, by the gas introduction pipe 9 at 2000 sccm. Microwaves of 2.45 GHz through the microwave wave-guide 8 are set to an output of 250 W, matching is achieved with a tuner, and electrical discharging is implemented. Reflection waves at this time are 0 W. $H_2$ gas is introduced into the quartz pipe 6, which has a diameter of 30 mm, by the gas introduction pipe 10 at 500 sccm, and high frequency waves at 13.56 MHz are set to an output of 100 W. Reflection waves are 0 W. In this state, a vapor of trimethyl gallium (TMGa), which is maintained at 0° C., is bubbled at a pressure of $10^6$ Pa using hydrogen as a carrier gas, and introduced at 0.2 sccm by the gas introduction pipe 12, while passing through a mass flow controller. $H_2$ gas at a pressure of 65,000 Pa is introduced to cyclopentadienyl magnesium, which is maintained at 20° C., by the gas introduction pipe 12, and introduced through a mass flow controller to a reaction region at 1 sccm. A reaction pressure measured with a Baratron vacuum gauge at this time is 6.7 Pa. This deposition is performed for 120 minutes, and a 0.1-μm Mg-doped GaN:H film (the semiconductor layer 28) is produced.

Thereon, a 1 by 1 mm Au electrode (a light-receiving electrode and terminal portion, i.e., the electrode 30) is produced by vacuum deposition to a thickness of 50 nm. Thus, a light-receiving element (the light-receiving element 20) is produced.

Then, an insulative substrate at which Au terminal electrode wiring is formed by plating between a front face, an end face and a part of a rear face of a ceramic substrate with a size of 1.5 by 2.5 mm is prepared (the insulative substrate 22 at which the terminal electrodes 32 are provided). The terminal electrode wiring is formed at two locations on the substrate, and respective widths of the wiring are 0.5 mm.

A thermosetting conductive paste (the conductive members 34) is dripped on the terminal electrodes that are exposed at the front face of the insulative substrate. Positioning of the light-receiving element is implemented and the light-receiving element is laid on the insulative substrate. Thus, conduction paths are formed by the conductive paste between the terminal electrodes of the insulative substrate and the electrodes of the light-receiving element, and the light-receiving element is adhered and fixed on the insulative substrate. A curing temperature of the thermosetting conductive paste is 160° C., for 30 minutes. Thus, a light detection device capable of surface-mounting at a flat surface is produced. Thickness thereof is 1 mm.

The produced light detection device is placed on an electronic circuit board, and positioning is implemented, so that the terminal electrodes that are exposed at the end face of the insulative substrate are mounted on cream solders, which have been printed on the electronic circuit board. Heating processing is applied thereto for 30 seconds at 250° C. Thus, surface-mounting of the light detection device on the circuit board is achieved.

Example 2

A light detection device capable of surface-mounting at a flat surface is produced in the same manner as Example 1 except that: on a face of the light-receiving element (excluding portions corresponding to the electrodes), the face being to oppose the insulative substrate, a silicone resin (SILICONE SEALANT KE450) is coated to a thickness of approximately 20 μm (the adhesive layer 36); and the light-receiving element is fixed by adhesion to the insulative substrate by the silicone resin. Thickness of the light detection device is 1 mm.

The produced light detection device is placed on an electronic circuit board, and positioning is implemented, so that the terminal electrodes that are exposed at the end face of the insulative substrate are mounted on cream solders, which have been printed on the electronic circuit board. Heating processing is applied thereto for 30 seconds at 250° C. Thus, surface-mounting of the light detection device on the circuit board is achieved.

What is claimed is:

1. A light detection device comprising:
   a light-receiving element including
   a semiconductor layer for detecting light and
   a first electrode which is electrically connected with the semiconductor layer;
   an insulative substrate for supporting the light-receiving element; and
   a second electrode which is provided at least a part of a first face and at least a part of a second face of the insulative substrate, the second electrode extending through the insulative substrate,
   wherein the light-receiving element is disposed on the first face of the insulative substrate, and
   the first electrode is electrically connected with the second electrode that is provided at the at least a part of the first face of the insulative substrate.

2. The light detection device of claim 1, wherein the first electrode is constituted by at least two electrodes, and the second electrode is constituted by at least two electrodes.

3. The light detection device of claim 1, wherein the second electrode comprises a metal electrode.

4. The light detection device of claim 1, wherein the insulative substrate absorbs visible light.

5. The light detection device of claim 1, wherein the light-receiving element includes a transparent substrate on which the semiconductor layer and the first electrode are disposed.

6. The light detection device of claim 1, wherein the light-receiving element comprises a transparent substrate,
   the first electrode comprises a first layer and a second layer, and the first layer, the semiconductor layer and the second layer are laminated on the transparent substrate in this order, and
   the first layer of the first electrode is transparent.

7. The light detection device of claim 1, wherein the first electrode is connected with the second electrode that is provided at the at least a part of the first face of the insulative substrate via a conductive member.

8. The light detection device of claim 7, wherein, excluding a portion that is connected by the conductive member, at least a portion of a face of the light-receiving element which face opposes the insulative substrate is fixed to the insulative substrate with an adhesive layer therebetween.

9. The light detection device of claim 1, wherein a recess portion is formed in the insulative substrate, and the light-receiving element is embedded in the recess portion.

10. The light detection device of claim 1, wherein the semiconductor layer of the light-receiving element comprises a nitride including nitrogen and at least one element selected from the group consisting of Al, Ga and In.

11. The light detection device of claim 10, wherein the nitride comprises hydrogen, with a hydrogen density of at least approximately 0.5 at % and at most approximately 50 at %.

12. The light detection device of claim 1, wherein the semiconductor layer comprises an oxide semiconductor.

13. The light detection device of claim 1, wherein the second face is a face corresponding to an opposite face with respect to the first face of the insulative substrate.

14. The light detection device of claim 1, wherein a plurality of the light-receiving elements are provided on the insulative substrate.

15. A light detection device mounting method, comprising:
preparing a light-receiving element which includes a semiconductor layer for detecting light and a first electrode which is electrically connected with the semiconductor layer;
providing a second electrode at at least a part of a first face and at least a part of a second face of an insulative substrate, the second electrode extending through the insulative substrate;
preparing the light detection device by disposing the light-receiving element on the first face of the insulative substrate such that the first electrode is electrically connected with the second electrode that is provided at the at least a part of the first face of the insulative substrate; and
surface-mounting the light detection device on a circuit board such that the second electrode that is provided at the at least a part of the second face of the insulative substrate is connected with an external terminal of the circuit board.

16. The light detection device mounting method of claim 15, wherein the first electrode is constituted by at least two electrodes, and the second electrode is constituted by at least two electrodes.

17. The light detection device mounting method of claim 15, wherein the second electrode comprises a metal electrode.

18. The light detection device mounting method of claim 15, wherein the insulative substrate absorbs visible light.

19. The light detection device mounting method of claim 15, wherein the light-receiving element includes a transparent substrate on which the semiconductor layer and the first electrode are disposed.

20. The light detection device mounting method of claim 15, wherein the semiconductor layer of the light-receiving element comprises a nitride including nitrogen and at least one element selected from the group consisting of Al, Ga and In.

21. The light detection device mounting method of claim 15, wherein the second face is a face corresponding to an opposite face with respect to the first face of the insulative substrate.

22. The light detection device of claim 1, wherein the second electrode is formed through a through-hole provided in the insulative substrate.

23. The light detection device mounting method of claim 15, wherein the second electrode is formed through a through-hole provided in the insulative substrate.

* * * * *